(12) United States Patent
Li et al.

(10) Patent No.: US 7,965,061 B2
(45) Date of Patent: Jun. 21, 2011

(54) CONVERSION SYSTEMS WITH BALANCED CELL CURRENTS

(75) Inventors: Guoxing Li, Sunnyvale, CA (US); Xiaohu Tang, Shanghai (CN)

(73) Assignee: O2Micro, Inc., Santa Clara, CA (US)

( * ) Notice: Subject to any disclaimer, the term of this patent is extended or adjusted under 35 U.S.C. 154(b) by 520 days.

(21) Appl. No.: 12/082,913

(22) Filed: Apr. 15, 2008

(65) Prior Publication Data

US 2009/0195213 A1    Aug. 6, 2009

Related U.S. Application Data

(60) Provisional application No. 61/063,205, filed on Feb. 1, 2008.

(51) Int. Cl.
*H02J 7/00* (2006.01)
*H02J 7/04* (2006.01)
*H02J 7/16* (2006.01)
*G01N 27/416* (2006.01)

(52) U.S. Cl. ........ 320/152; 320/116; 320/157; 320/162; 324/429; 324/430; 324/433

(58) Field of Classification Search .................... 320/152
See application file for complete search history.

(56) References Cited

U.S. PATENT DOCUMENTS

| 2006/0082343 | A1 | 4/2006 | Sobue et al. |
| 2007/0030056 | A1* | 2/2007 | Sobue et al. ............ 327/543 |
| 2008/0088277 | A1* | 4/2008 | Wang et al. ............ 320/119 |
| 2008/0100266 | A1 | 5/2008 | Sobue |

FOREIGN PATENT DOCUMENTS

| CN | 1449085 | 10/2003 |
| EP | 0992811 | 4/2000 |

OTHER PUBLICATIONS

English Translation for Abstract of CN1449085A, 2003.
English Translation for First Office Action of Chinese Patent Application No. 200910005576.6, 2003.

* cited by examiner

*Primary Examiner* — Edward Tso
*Assistant Examiner* — Ahmed Omar

(57) ABSTRACT

A conversion system includes a conversion circuit coupled to multiple cells for generating multiple sampling signals indicative of the cell voltages of the cells respectively. Each sampling signal is with respect to the same reference level. In addition, the conversion system includes a compensation circuit coupled to the conversion circuit for generating a compensation current that flows through at least one cell of the multiple cells via the conversion circuit for balancing the currents respectively flowing through the cells.

24 Claims, 6 Drawing Sheets

CONVERSION SYSTEMS WITH BALANCED CELL CURRENTS

RELATED APPLICATION

This application claims priority to U.S. Provisional Application No. 61/063,205, filed on Feb. 1, 2008, which is hereby incorporated by reference in its entirety.

TECHNICAL FIELD

The present invention relates to conversion systems and in particular to conversion systems with balanced cell currents.

BACKGROUND ART

Some conventional voltage comparison circuits need voltage trimming. For example, if a voltage at a first terminal is $V_1$, a voltage at a second terminal is $V_2$, a voltage $V_{12}$ between the first terminal and the second terminal can be given by: $V_{12}=V_1-V_2$. In order to compare the voltage $V_{12}$ with one or more reference voltages to check the cell condition such as over-voltage or under-voltage, the reference voltages may need to be with respect to a reference level that is equal to $V_2$ (or $V_1$). Besides, the reference level may need to be adjusted according to different requirements, which may require a lot of reference voltage trimming process. In some conventional battery protection controllers for multiples cells in series, all the cell voltages may need to be compared with one or more trimmed reference voltages. Such battery protection controller may require a lot of trimming process, which may increase the cost. Therefore, voltage conversion circuits can be used to shift the cell voltages with respect to ground and then to compare cell voltages with one or more predetermined ground-based reference voltages.

FIG. 1 illustrates a block diagram of a conventional voltage-to-voltage conversion circuit 100. As show in FIG. 1, the conversion circuit 100 includes a plurality of cells 102_1-102_4 having a plurality of cell voltages $V_{102\_1}$, $V_{102\_2}$, $V_{102\_3}$ and $V_{102\_4}$ respectively, a plurality of switches 104_1-104_4 coupled to the cells 102_1-102_4, a plurality of switches 106_1-106_4 coupled to the cells 102_1-102_4, and a voltage level shifter 140 coupled between the switches 104_1-104_4 and the switches 106_1-106_4. The voltage level shifter 140 can output a voltage 130 indicative of the cell voltage $V_{102\_1}$, $V_{102\_2}$, $V_{102\_3}$ or $V_{102\_4}$ of each cell 102_1-102_4 by tuning on each switch of the plurality of switches 104_1-104_4 and each switch of the plurality of switches 106_1-106_4 sequentially. For example, when the switch 104_4 and the switch 106_4 are turned on, the voltage level shifter 140 can output a voltage 130 that is proportional to the cell voltage of the cell 102_4 by applications of an operational amplifier 120 and resistors 112, 114, 116 and 118.

When the switches 104_4 and 106_4 are on, if $I_{102\_3}$ is a current flowing through the cells 102_1-102_3, $I_{106\_4}$ is a current flowing through the switch 106_4, a current $I_{102\_4}$ flowing through the cell 102_4 can be given by:

$$I_{102\_4}=I_{102\_3}-I_{106\_4}.$$

As a result, the current $I_{102\_4}$ flowing through the cell 102_4 is unbalanced with the current $I_{102\_3}$ flowing through the cells 102_1-102_3. Similarly, when sampling the cell voltages of the cells 102_1-102_3, the currents flowing through the cells 102_1-102_4 are also unbalanced.

Furthermore, the conversion circuit 100 can only sample the cell voltage of each cell of the cells 102_1-102_4 sequentially, which may not meet the requirement of sampling all the cells voltage simultaneously in many applications.

FIG. 2 illustrates a block diagram of a conventional voltage-to-current conversion circuit 200. As shown in FIG. 2, the conversion circuit 200 includes a plurality of cells 202_1-202_4, and a plurality of voltage-to-current converters 212_1-212_4 respectively coupled to the plurality of cells 202_1-202_4 in parallel. As shown in FIG. 2, each of the converters 212_2-212_4 includes a corresponding operational amplifier (204_2, 204_3, or 204_4), a corresponding PMOSFET (206_2, 206_3, or 206_4), and a corresponding resister (208_2, 208_3, or 208_4) respectively. The converter 212_1 includes a resistor 208_1. The converters 212_1-212_4 can convert cell voltages of the cells 202_1-202_4 to currents $I_{208\_1}$, $I_{208\_2}$, $I_{208\_3}$ and $I_{208\_4}$ respectively. For example, a current $I_{208\_i}$ flowing through the resistor 208_i can be given by:

$$I_{208\_i}=V_{202\_i}/R_{208\_i},$$

where $V_{202\_i}$ is a cell voltage of the cell 202_i and $R_{208\_i}$ is a resistance of the resistor 208_i (i=1, 2, 3, 4).

As shown in FIG. 2, $I_{204\_2}$, $I_{204\_3}$ and $I_{204\_4}$ are the operation currents of the operational amplifiers 204_2-204_4 respectively, and $I_{208\_1}$, $I_{208\_2}$, $I_{208\_3}$ and $I_{208\_4}$ are the currents flowing through the resistors 208_1-208_4 respectively. If the voltages $V_{202\_1}$, $V_{202\_2}$, $V_{202\_3}$ and $V_{202\_4}$ are equal to the same voltage $V_{202}$, and the resistors $R_{208\_1}$, $R_{208\_2}$, $R_{208\_3}$ and $R_{208\_4}$ have the same resistance $R_{208}$, then the currents $I_{208\_1}$, $I_{208\_2}$, $I_{208\_3}$ and $I_{208\_4}$ are equal to the same current $I_{208}$ ($I_{208}=V_{202}/R_{208}$). Besides, the currents $I_{204\_2}$, $I_{204\_3}$ and $I_{204\_4}$ can be equal to the same current $I_{204}$. As such, the currents $I_{202\_1}$, $I_{202\_2}$, $I_{202\_3}$ and $I_{202\_4}$ respectively flowing through the cells 202_1-202_4 can be given by:

$$I_{202\_4} = I_{204\_4} + I_{208\_4} + I_{204\_3} + I_{204\_2}$$
$$= 3*I_{204} + I_{208},$$

$$I_{202\_3} = I_{202\_4} + I_{208\_3}$$
$$= 3*I_{204} + 2*I_{208},$$

$$I_{202\_2} = I_{202\_3} + I_{208\_2}$$
$$= 3*I_{204} + 3*I_{208}, \text{ and}$$

$$I_{202\_1} = I_{202\_2} + I_{208\_1}$$
$$= 3*I_{204} + 4*I_{208}.$$

As a result, the currents $I_{202\_1}$, $I_{202\_2}$, $I_{202\_3}$, and $I_{202\_4}$ respectively flowing through the cells 202_1-202_4 are not balanced with each other.

BRIEF DESCRIPTION OF THE DRAWINGS

The accompanying drawings, which are incorporated in and form a part of this specification, illustrate embodiment of the present invention and, together with the description, serve to explain the principles of the invention.

SUMMARY

In one embodiment, a conversion system includes a conversion circuit coupled to multiple cells for generating multiple sampling signals indicative of the cell voltages of the cells respectively. Each sampling signal is with respect to the same reference level. In addition, the conversion system includes a compensation circuit coupled to the conversion circuit for generating a compensation current that flows through at least one cell of the multiple cells via the conversion circuit for balancing the currents respectively flowing through the cells, in one embodiment.

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

In one embodiment, the present invention provides a conversion system that can be used for sampling the cell voltages of multiple cells simultaneously. The currents respectively flowing through the cells can be balanced with each other when the cell voltages are being sampled. More specifically, a plurality of converters (e.g., voltage-to-current converters, voltage-to-voltage converters, voltage-to-frequency converters, voltage-to-temperature converters) can be respectively coupled to a plurality of cells in parallel, such that the plurality of converters can respectively convert the cell voltages of the plurality of cells to a plurality of sampling signals (e.g., sampling voltages, sampling currents, sampling frequencies, sampling temperatures) simultaneously. In one embodiment, the plurality of sampling signals can respectively indicate the cell voltages of the plurality of cells. In addition, a compensation circuit can be implemented in the conversion system for balancing currents respectively flowing through the plurality of cells.

Figure 1:
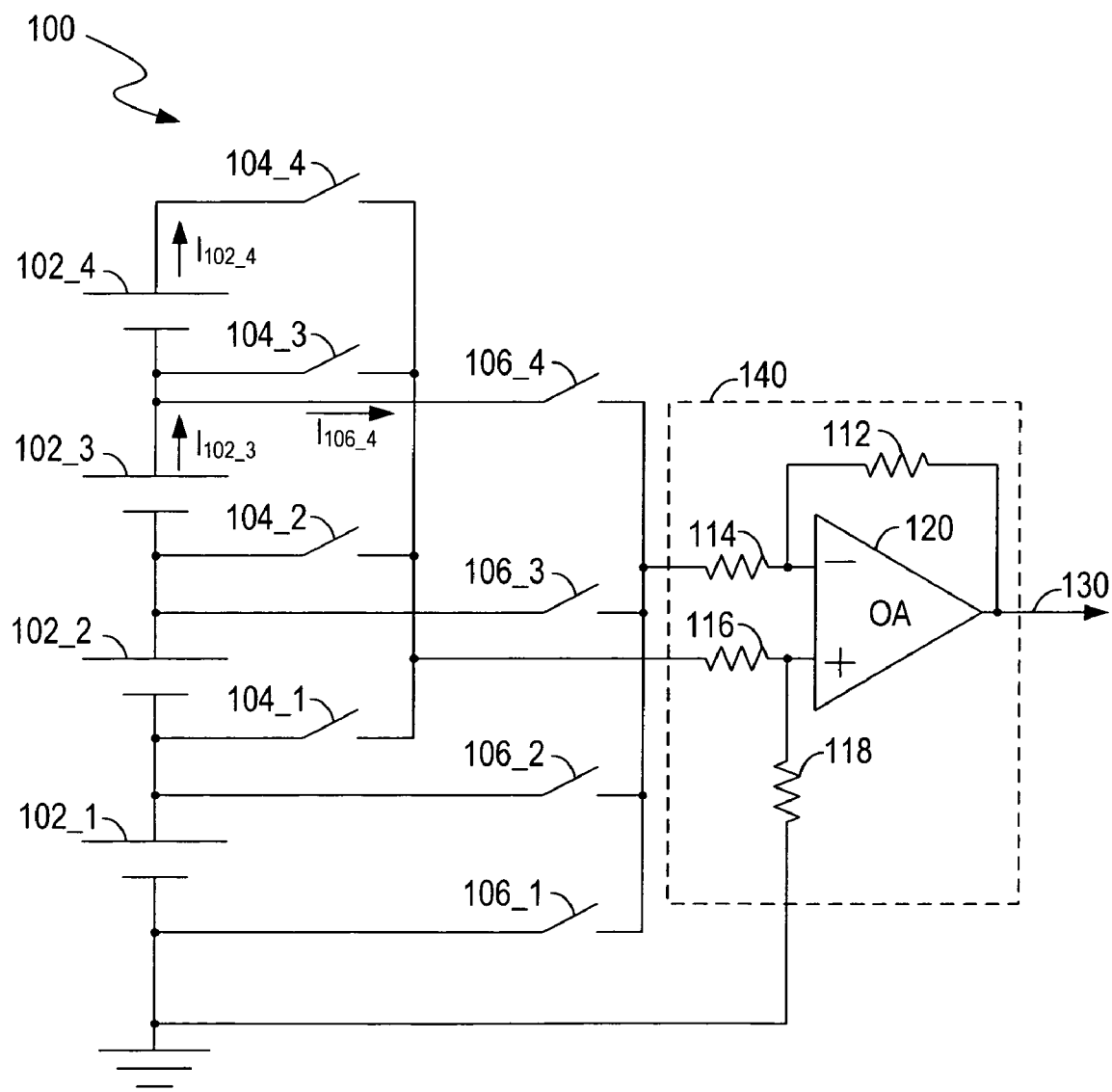
FIG. 1 illustrates a block diagram of a voltage-to-voltage conversion circuit, in accordance with the prior art.
Figure 2:
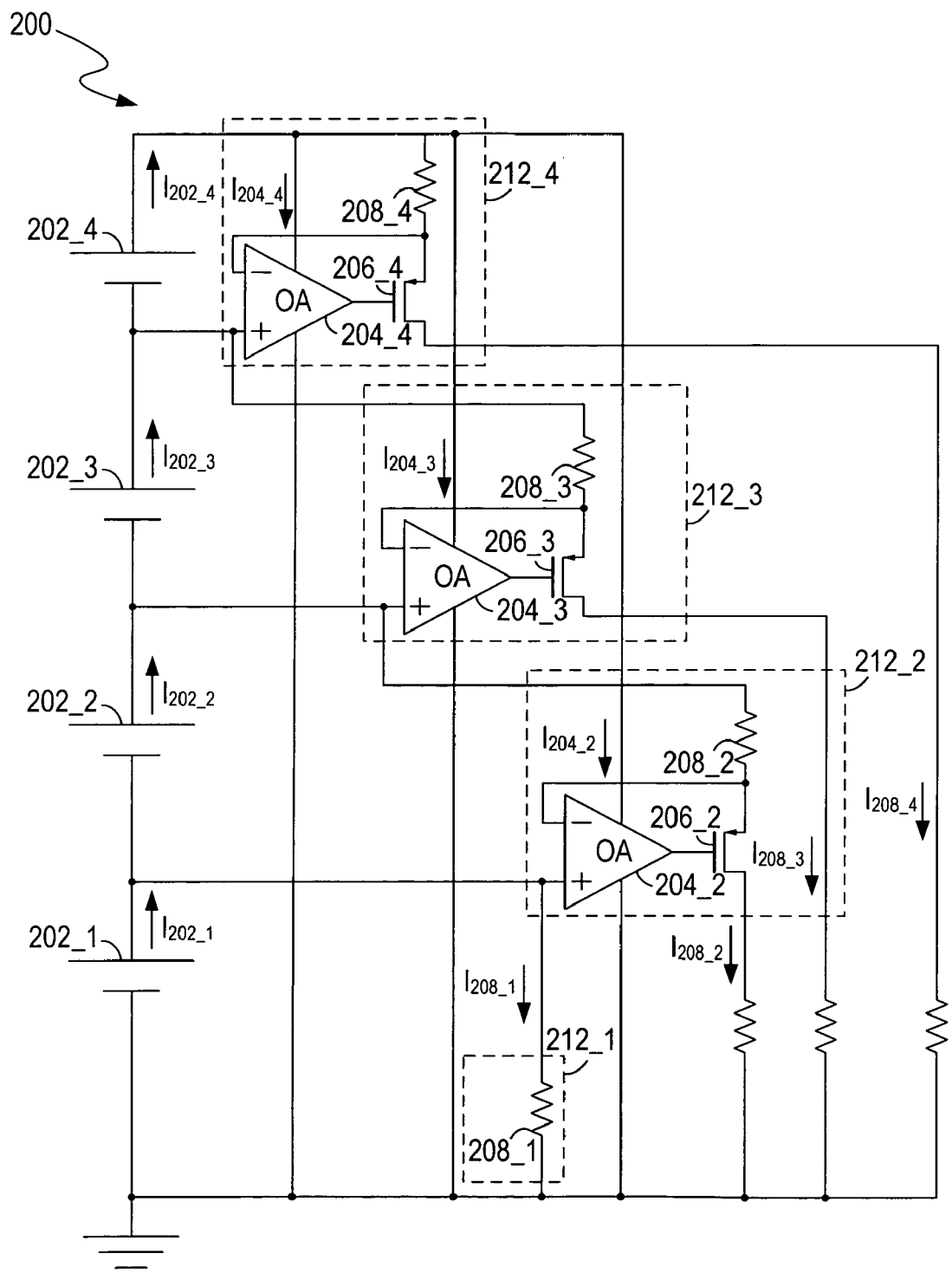
FIG. 2 illustrates a block diagram of a voltage-to-current conversion circuit, in accordance with the prior art.
Figure 3A:
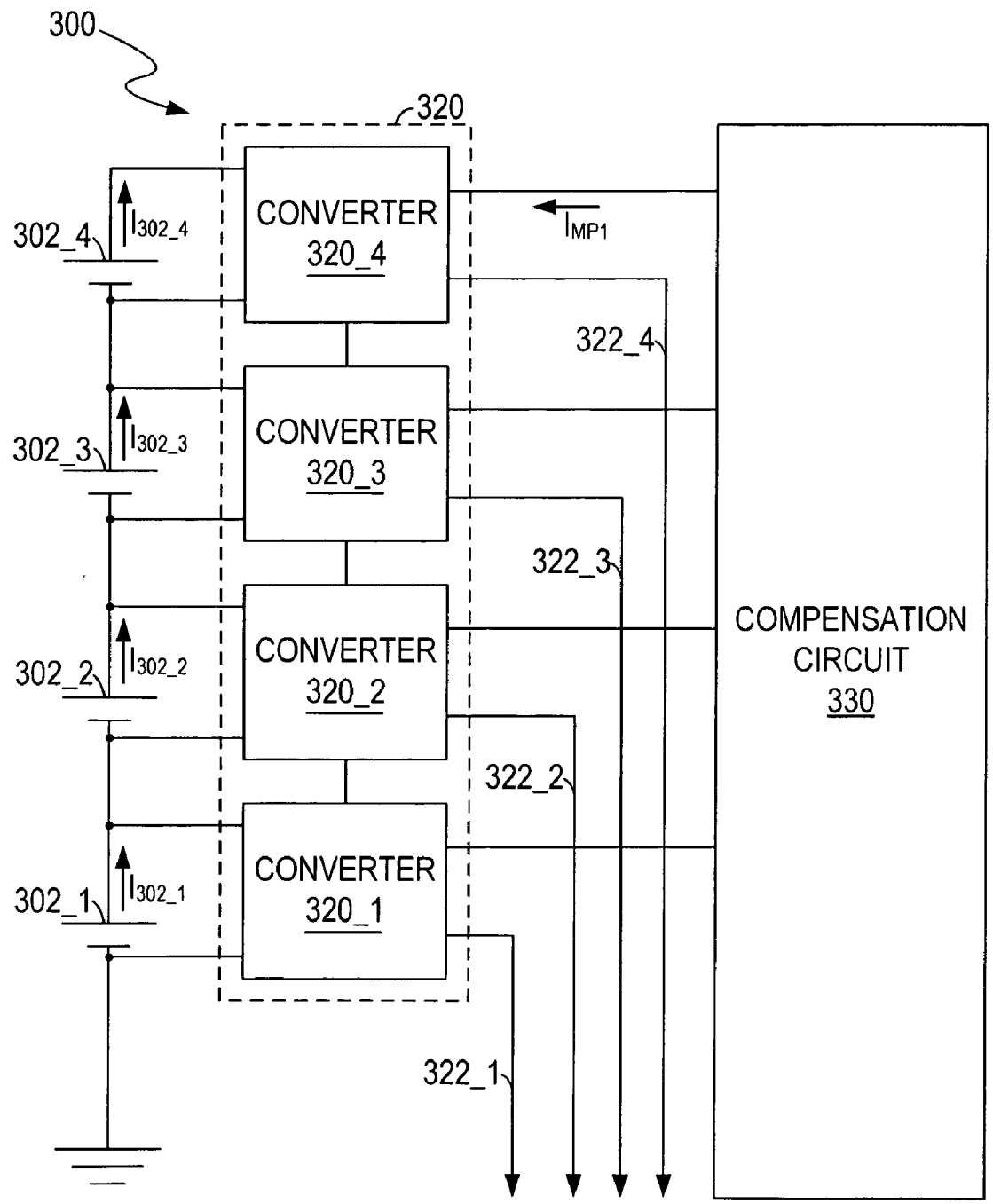
FIG. 3A illustrates an exemplary block diagram of a conversion system, in accordance with one embodiment of the present invention.

FIG. 3A illustrates an exemplary block diagram of a conversion system 300, in accordance with one embodiment of the present invention. The conversion system 300 may include a conversion circuit 320 coupled to a plurality of cells 302_1-302_4 for generating a plurality of sampling signals 322_1-322_4 indicative of a plurality of cell voltages of the plurality of cells 302_1-302_4 respectively. In one embodiment, a level of each sampling signals 322_1-322_4 is with respect to the same reference level Vref. In the example of FIG. 3A, four cells 302_1-302_4 are illustrated. However, any number of cells can be included in the conversion system 300.

As shown in FIG. 3A, the conversion circuit 320 may include a plurality of converters 320_1-320_4 coupled to the plurality of cells 302_1-302_4 in parallel respectively. Each converter 320_1-320_4 can generate a corresponding sampling signal of the plurality of sampling signals 322_1-322_4.

In one embodiment, the plurality of sampling signals 322_1-322_4 can be a plurality of sampling currents $I_{322\_1}$, $I_{322\_2}$, $I_{322\_3}$, and $I_{322\_4}$. More specifically, in one embodiment, each converter 320_1-320_4 can convert a cell voltage of a corresponding cell of the plurality of cells 302_1-302_4 to a current $I_{322\_1}$, $I_{322\_2}$, $I_{322\_3}$, or $I_{322\_4}$. The plurality of currents $I_{322\_1}$, $I_{322\_2}$, $I_{322\_3}$, and $I_{322\_4}$ generated by the converters 320_1-320_4 can indicate (be proportional to) the cell voltages of the plurality of cells 302_1-302_4 respectively. In another embodiment, the plurality of sampling signals 322_1-322_4 can be a plurality of sampling voltages. For example, each of the converted currents $I_{322\_1}$, $I_{322\_2}$, $I_{322\_3}$, and $I_{322\_4}$ can be converted to a corresponding voltage by a corresponding resistor (not shown in FIG. 3A), in one embodiment.

The converted currents $I_{322\_1}$, $I_{322\_2}$, $I_{322\_3}$, and $I_{322\_4}$ can be sampled/monitored by a sampling circuit/monitor (not shown in FIG. 3A). As such, the conversion system 300 can be used for sampling/monitoring cell voltages of the plurality of cells 302_1-302_4 simultaneously, in one embodiment.

The converted currents $I_{322\_1}$, $I_{322\_2}$, $I_{322\_3}$, and $I_{322\_4}$ can also be fed into a comparator (or a winner-take-all network) for detecting undesirable cell conditions (e.g., over-charging conditions, over-discharging conditions) of the plurality of cells 302_1-302_4. In one embodiment, the converted currents $I_{322\_1}$, $I_{322\_2}$, $I_{322\_3}$, and $I_{322\_4}$ can also be converted to voltages by corresponding resistors, and each of the voltages is then compared with a reference voltage for detecting undesirable cell conditions (e.g., over-charging conditions, over-discharging conditions). Therefore, the conversion system 300 can be used in battery protection applications for the plurality of cells 302_1-302_4. In addition, the conversion system 300 can be used in cell balancing systems.

Furthermore, the conversion system 300 may include a compensation circuit 330 coupled to the conversion circuit 320 for generating a compensation current $I_{MP1}$ that flows through at least one cell of the plurality of cells 302_1-302_4 via the conversion circuit 320 for balancing a plurality of currents (shown as $I_{302\_1}$, $I_{302\_2}$, $I_{302\_3}$, and $I_{302\_4}$) respectively flowing through the cells 302_1-302_4. In one embodiment, the compensation current $I_{MP1}$ can flow through at least a top cell 302_4 of the plurality of cells 302_1-302_4 via the conversion circuit 320. In one embodiment of the present disclosure, the top cell is a cell that is closest to the battery pack's positive terminal. Advantageously, the conversion system 300 can sample the cell voltages for the plurality of cells 302_1-302_4 simultaneously, and the currents flowing through the plurality of cells 302_1-302_4 can be balanced.

Figure 3B:
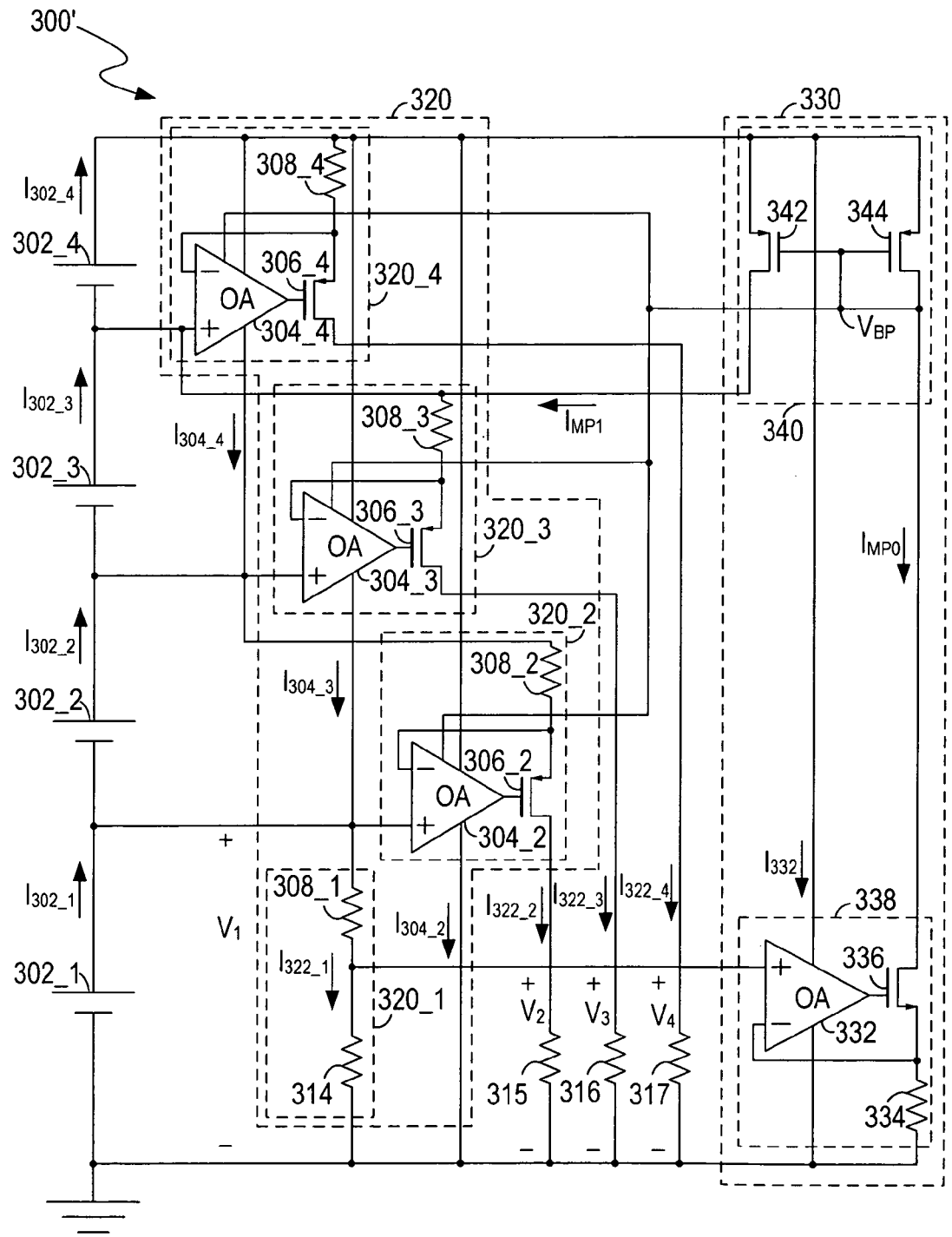
FIG. 3B illustrates an exemplary detailed circuit diagram of a conversion system, in accordance with one embodiment of the present invention.

FIG. 3B shows an exemplary detailed circuit diagram of a conversion system 300', in accordance with one embodiment of the present invention. Elements that are labeled the same as in FIG. 3A have similar functions and will not be repetitively described herein. As shown in FIG. 3B, each converter of the converters 320_2-320_4 may include a corresponding operational amplifier (304_2, 304_3, or 304_4) coupled to a corresponding cell (302_2, 302_3, or 302_4) in parallel, a corresponding resistor (308_2, 308_3, or 308_4) coupled between the corresponding operational amplifier (304_2, 304_3, or 304_4) and the corresponding cell (302_2, 302_3, or 302_4), and a corresponding switch (e.g., MOSFET 306_2, 306_3, or 306_4) coupled between the corresponding operational amplifier (304_2, 304_3, or 304_4) and the corresponding resistor (308_2, 308_3, or 308_4). In one embodiment, the converter 320_1 includes a resistor 308_1 and a resistor 314.

In one embodiment, since the voltage at the positive terminal of the operational amplifier 304_4 is forced to be equal to the voltage at the negative terminal of the operational amplifier 304_4, a voltage of the resistor 308_4 is equal to the cell voltage $V_{302\_4}$ of the cell 302_4. Assume that a resistance of the resistor 308_4 is $R_{308}$, then the sampling current $I_{322\_4}$ flowing through the resistor 308_4 can be given by:

$$I_{322\_4}=V_{302\_4}/R_{308}. \tag{1a}$$

Similarly, resistors 308_3 and 308_2 can have the same resistance $R_{308}$, and the flowing equations can be obtained:

$$I_{322\_3}=V_{302\_3}/R_{308}, \text{ and} \tag{1b}$$

$$I_{322\_2}=V_{302\_2}/R_{308}, \tag{1c}$$

where $V_{302\_3}$ is the cell voltage of the cell 302_3 and $V_{302\_2}$ is the cell voltage of the cell 302_2. In one embodiment, a resistance $R_{308\_1}$ of the resistor 308_1 plus a resistance $R_{314}$ of the resistor 314 can be equal to $R_{308}$, such that:

$$I_{322\_1}=V_{302\_1}/R_{308}, \tag{1d}$$

where $V_{302\_1}$ is the cell voltage of the cell 302_1. As such, the sampling currents $I_{322\_1}$, $I_{322\_2}$, $I_{322\_3}$, and $I_{322\_4}$ can indicate (be proportional to) the cell voltages $V_{302\_1}$, $V_{302\_2}$, $V_{302\_3}$, and $V_{302\_4}$ of the cells 302_1-302_4 respectively.

In one embodiment, each sampling current $I_{322\_1}$, $I_{322\_2}$, $I_{322\_3}$, and $I_{322\_4}$ can be converted to a corresponding voltage (shown as $V_1$, $V_2$, $V_3$, or $V_4$) by a corresponding resistor (e.g., resistor 380_1 together with resistor 314, resistor 315, 316, or 316). Therefore, each sampling signal 322_1-322_4 as shown in FIG. 3A can also be a sampling voltage (e.g., $V_1$, $V_2$, $V_3$, or $V_4$) proportional to a corresponding cell voltage ($V_{302\_1}$, $V_{302\_2}$, $V_{302\_3}$, or $V_{302\_4}$) of a corresponding cell 302_1-302_4.

In one embodiment, each sampling voltage $V_1$, $V_2$, $V_3$, and $V_4$ is with respect to the same reference level Vref. Therefore, each sampling voltage $V_1$, $V_2$, $V_3$, or $V_4$ can be compared with a reference voltage that is also with respect to the same reference level Vref for battery protection/management purposes. As a result, multiple trimmed references and the cost for trimming can be avoided. In one embodiment, the reference level Vref can be ground, such that only one trimming process for the reference voltage Vref may be used.

As shown in FIG. 3B, the compensation circuit 330 can include a converter 338 coupled to the conversion circuit 320 for receiving at least one sampling signal, e.g., sampling signal 322_1, and for generating a reference current $I_{MP0}$ according to the received sampling signal. In addition, the compensation circuit 330 can include a current source 340 (e.g., a reference current source, a current mirror) coupled to the converter 338 for receiving the reference current $I_{MP0}$, and for generating the compensation current $I_{MP1}$ according to the reference current $I_{MP0}$. In one embodiment, as shown in FIG. 3B, a voltage $V_{BP}$ at the gate of the MOSFET 342/344 can be used as a bias voltage for the operational amplifiers 304_2-304_4.

More specifically, the converter 338 can include an operational amplifier 332 coupled to the converter 320_1, a resistor 334 coupled between the operational amplifier 332 and the converter 320_1, and a switch 336 (e.g., a MOSFET) coupled between the resistor 334 and the operational amplifier 332. In the example of FIG. 3B, the voltage at the positive terminal of the operational amplifier 332 is forced to be equal to the voltage at the negative terminal of the operational amplifier 332, such that the following equation can be obtained:

$$I_{322\_1}*R_{314}=I_{MP0}*R_{334}, \tag{2}$$

where $R_{334}$ is a resistance of the resistor 334. Therefore, the current $I_{MP0}$ can be given by:

$$I_{MP0}=I_{322\_1}*R_{314}/R_{334}. \tag{3}$$

In one embodiment, the current source 340 can be a current mirror. As such, the compensation current $I_{MP1}$ can be given by:

$$I_{MP1}=I_{MP0}=I_{322\_1}*R_{314}/R_{334}. \tag{4}$$

In one embodiment, $I_{304\_2}$, $I_{304\_3}$, and $I_{304\_4}$ are operation currents of the operational amplifiers 304_2-304_4 respectively, and $I_{332}$ is an operation current of the operational amplifier 332. The operation current of an operational amplifier is the current that flows from the power terminal of the operational amplifier to the floating ground of the operational amplifier, in one embodiment. In one embodiment, the converter 320_4 can include the operational amplifier 304_4 coupled to an upper cell 302_4 in parallel, and the operation current $I_{304\_4}$ of the operational amplifier 304_4 can flow into a positive terminal of a lower cell 302_2. Similarly, the converter 320_3 can include the operational amplifier 304_3 coupled to an upper cell 302_3 in parallel, and the operation current $I_{304\_3}$ of the operational amplifier 304_3 can flow into a positive terminal of a lower cell 302_1. In addition, in the example of FIG. 3B, the compensation current $I_{MP1}$ flows through the top cell 302_4 of the plurality of cells 302_1-302_4 via the conversion circuit 320, in one embodiment.

Accordingly, the currents respectively flowing through cells 302_1-302_4 can be obtained as follows:

$$I_{302\_1}=I_{322\_1}+I_{322\_2}+I_{322\_3}+I_{322\_4}+I_{304\_2}+I_{332}+I_{MP0}, \tag{5a}$$

$$I_{302\_2}=I_{302\_1}+I_{304\_3}-I_{322\_1}, \tag{5b}$$

$$I_{302\_3}=I_{302\_2}+I_{304\_4}-I_{322\_2}, \text{ and} \tag{5c}$$

$$I_{302\_4}=I_{302\_3}+I_{MP1}-I_{322\_3}. \tag{5d}$$

In one embodiment, current $I_{304\_3}$ can be designed to be equal to current $I_{322\_1}$, and current $I_{304\_4}$ can be designed to be equal to current $I_{322\_2}$. According to the equation (4), when $R_{314}=R_{334}$, current $I_{MP1}$ can be equal to current $I_{322\_1}$. In one embodiment, if the cell voltages $V_{302\_1}$, $V_{302\_2}$, $V_{302\_3}$, and $V_{302\_4}$ are equal to the same voltage $V_{302}$, the sampling currents $I_{322\_1}$, $I_{322\_2}$, $I_{322\_3}$, and $I_{322\_4}$ can be equal to the same current $I_{322}$ ($I_{322}=V_{302}/R_{308}$). According to the equations (5a), (5b), (5c), and (5d), the following equation can be obtained:

$$I_{302\_4}=I_{302\_3}=I_{302\_2}=I_{302\_1}=4*I_{322}+(I_{304\_2}+I_{332}+I_{MP0}). \tag{6}$$

As a result, the currents $I_{302\_1}$, $I_{302\_2}$, $I_{302\_3}$, and $I_{302\_4}$ respectively flowing through the cells 302_1-302_4 can be balanced with each other. Advantageously, the compensation current $I_{MP1}$ can be proportional to at least one sampling signal (e.g., the sampling current $I_{322\_1}$). The operation current $I_{304\_4}$ can be proportional to the cell voltage $V_{302\_2}$ of the cell 302_2. The operation current $I_{304\_3}$ can be proportional to the cell voltage $V_{302\_1}$ of the cell 302_1. In one embodiment, the operation current $I_{304\_2}$ can be designed to be equal to, but is not limited to, the current $I_{322}$.

In the example of FIG. 3B, the compensation circuit 330 can generate one compensation current $I_{MP1}$ that flows through the top cell 302_4. However, depending on the number of cells and different applications, multiple compensation currents can also be generated by the compensation circuit 330 for balancing the currents respectively flowing through the plurality of cells. For example, the compensation circuit 330 can generate a compensation current that flows through the top two cells, in one embodiment.

In one embodiment, the current source 340 can be a reference current source which includes a MOSFET 342 having a width/length ratio $W_1/L_1$, and a MOSFET 344 having a width/length ratio $W_0/L_0$. The reference current source 340 can output a compensation current $I_{MP1}$ that is equal to $K*I_{MP0}$ ($I_{MP1}=K*I_{MP0}$). The parameter K can be defined by $W_1/L_1$ and $W_0/L_0$. As such, according to equation (4), the following equation can be obtained:

$$I_{MP1}=I_{322\_1}*k*R_{314}/R_{334}. \qquad (7)$$

Therefore, when $k*R_{314}/R_{334}=1$, the compensation current $I_{MP1}$ can also be equal to $I_{322\_1}$ by adjusting the parameters of the reference current source 340, in one embodiment.

Figure 4:
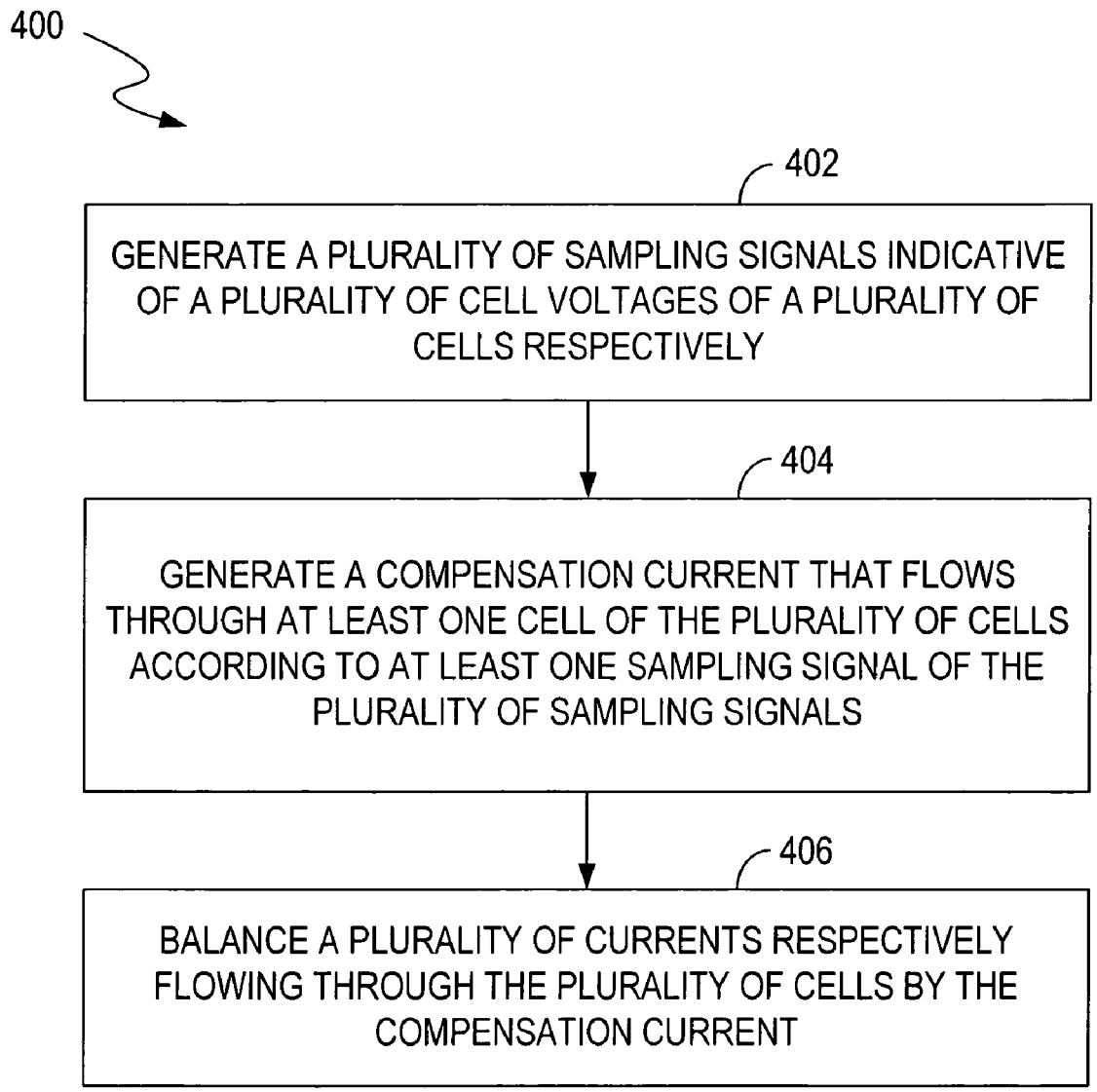
FIG. 4 illustrates an exemplary flowchart of operations performed by a conversion system, in accordance with one embodiment of the present invention.

FIG. 4 shows an exemplary flowchart 400 of operations performed by the conversion system 300', in accordance with one embodiment of the present invention. FIG. 4 is described in combination with FIG. 3A and FIG. 3B.

In block 402, a plurality of sampling signals 322_1-322_4 indicative of a plurality of cell voltages ($V_{302\_1}$, $V_{302\_2}$, $V_{302\_3}$, and $V_{302\_4}$) of the plurality of cells 302_1-302_4 can be generated respectively. In one embodiment, each sampling signal 322_1-322_4 is with respect to the same reference level Vref. For example, the reference level Vref can be ground.

More specifically, the sampling signals 322_1-322_4 can be generated by a plurality of converters 320_1-320_4 coupled to the cells 302_1-302_4 in parallel respectively. In one embodiment, each sampling signal 322_1-322_4 includes a sampling voltage (e.g., $V_1$, $V_2$, $V_3$, or $V_4$) proportional to a corresponding cell voltage of the plurality of cells voltages ($V_{302\_1}$, $V_{302\_2}$, $V_{302\_3}$, and $V_{302\_4}$). Each sampling voltages (e.g., $V_1$, $V_2$, $V_3$, or $V_4$) can be compared with at least one reference voltage that is also with respect to the reference level Vref.

In block 404, a compensation current $I_{MP1}$ that flows through at least one cell (e.g., the top cell 302_4) of the plurality of cells 302_1-302_4 can be generated according to at least one sampling signal. For example, a reference current $I_{MP0}$ can be generated according to the sampling signal 322_1, and the compensation current $I_{MP1}$ can be generated by the current source 340 coupled to the plurality of cells 302_1-302_4 according to the reference current $I_{MP0}$, in one embodiment.

In one embodiment, one converter of the plurality of converters 320_1-320_4 can include an operational amplifier coupled to an upper cell of the plurality of cells 302_1-302_4 in parallel, and an operation current of the operational amplifier can flow into a positive terminal of a lower cell of the plurality of cells 302_1-302_4. The aforementioned operation current can be proportional to a cell voltage of the aforementioned lower cell. In addition, the aforementioned compensation current $I_{MP1}$ can be proportional to the sampling signal (e.g., sampling signal 322_1) received by the compensation circuit 330. Consequently, as described in block 406, a plurality of currents respectively flowing through the plurality of cells can be balanced by the compensation current $I_{MP1}$ in one embodiment.

Figure 5:
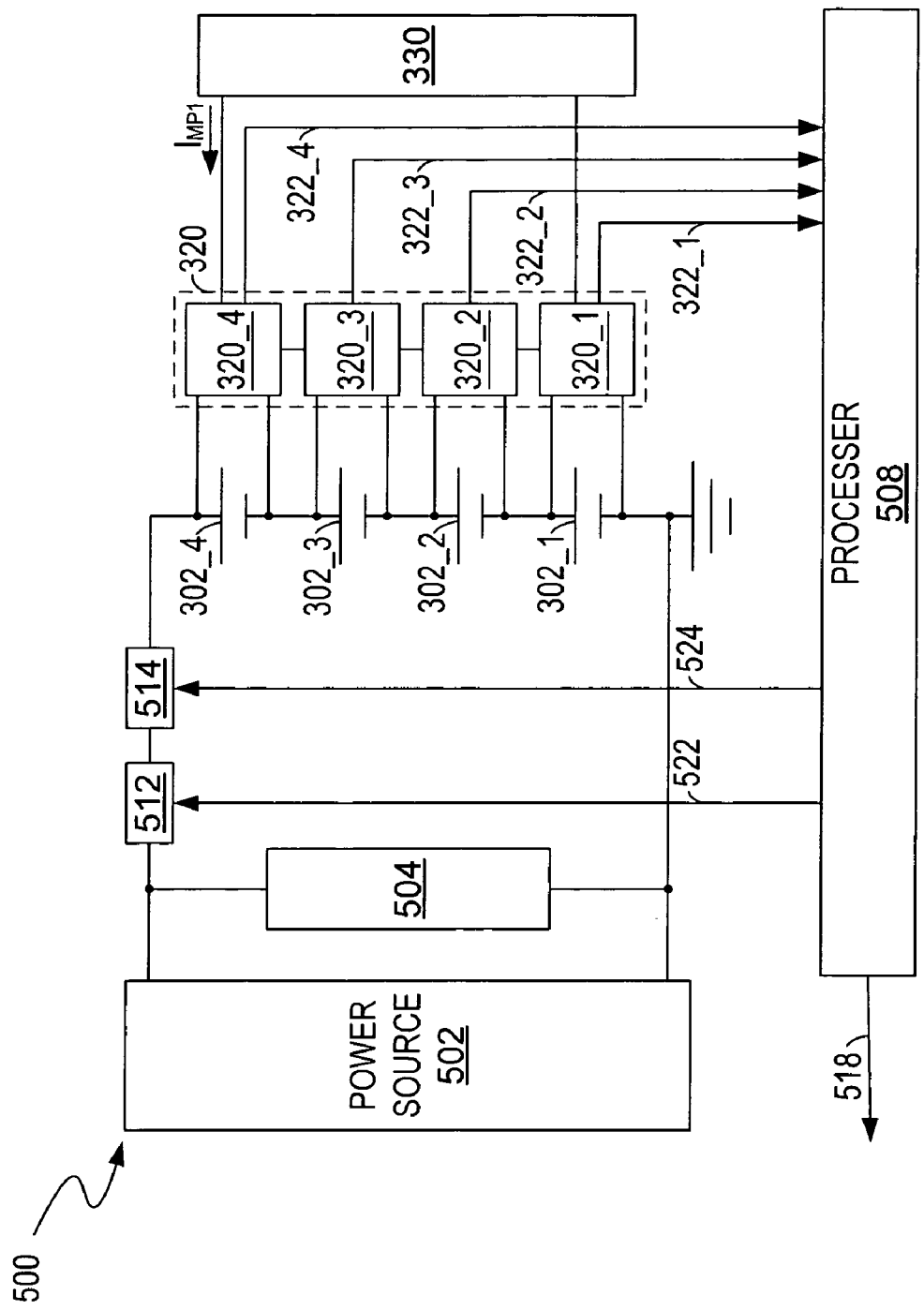
FIG. 5 illustrates an exemplary block diagram of a battery management system, in accordance with one embodiment of the present invention.

FIG. 5 shows an exemplary block diagram of a battery management system 500, in accordance with one embodiment of the present invention. Elements that are labeled the same as in FIG. 3A and FIG. 3B have similar functions and will not be repetitively described herein.

As shown in FIG. 5, the battery management system 500 includes the conversion circuit 320, the compensation circuit 330 and a processor 508. In one embodiment, the processor 508 can receive the plurality of sampling signals 322_1-322_4, and generate a control signal (e.g., 518, 522, 524, etc.) according to the sampling signals 322_1-322_4 for controlling the cells 302_1-302_4. A power source 502 (e.g., an adapter) can be used for charging the plurality of cells 302_1-302_4 and/or powering a load 504 (e.g., a system load). The load 504 can also be powered by the cells 302_1-302_4.

In one embodiment, if the power source 502 (e.g., an adapter) is available, the power source 502 can be used for charging the plurality of cells 302_1-302_4, and/or for powering the system load 504. When the power source 502 is charging the cells 302_1-302_4, the processor 508 can monitor the status of the cells 302_1-302_4 by receiving the sampling signals 322_1-322_4. If an undesirable condition (e.g., a battery over-charging condition) is monitored, the processor 508 can generate a control signal 522 to turn off a charging switch 512 for battery protection purposes.

In another embodiment, if the power source 502 is not available, the system load 504 can be powered by the cells 302_1-302_4. In one embodiment, when the plurality of cells 302_1-302_4 is used for powering the system load 504, the processor 508 can monitor the status of the plurality of cells 302_1-302_4 by receiving the sampling signals 322_1-322_4. If an undesirable condition (e.g., a battery over-discharging condition) is monitored, the processor 508 can generate a control signal 524 to turn off a discharging switch 514 for battery protection purposes.

Furthermore, if a cell voltage unbalance condition among the cells 302_1-302_4 is monitored by the processor 508, the processor 508 can generate a control signal 518 for controlling cell voltage balancing of the cells 302_1-302_4, in one embodiment. In one embodiment, if all the cells 302_1-302_4 are fully charged, the control signal 518 can also be used for terminating the battery charging.

Accordingly, the present invention provides a conversion system that can convert a plurality of cell voltages of the plurality of the cells to a plurality of sampling signals simultaneously. Advantageously, the currents respectively flowing through the cells can be balanced with each other. In one embodiment, the conversion system can be used in many applications, e.g., battery management systems, cell voltage sampling/monitoring systems, battery charging/discharging systems, and battery protection systems.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A conversion system comprising:
a conversion circuit coupled to a plurality of cells for generating a plurality of sampling signals indicative of a plurality of cell voltages of said plurality of cells respectively, wherein a level of each sampling signal of said plurality of sampling signals is with respect to a same reference level; and
a compensation circuit coupled to said conversion circuit for generating a compensation current that flows through at least one cell of said plurality of cells via said conversion circuit for balancing a plurality of currents respectively flowing through said plurality; wherein said compensation circuit comprises:
a converter coupled to said conversion circuit for receiving at least one sampling signal of said plurality of sampling signals and for generating a reference current according to said at least one sampling signal; and
a current source coupled to said converter for receiving said reference current and for generating said compensation current according to said reference current.

2. The conversion system as claimed in claim 1, wherein said compensation current flows through at least a top cell of said plurality of cells via said conversion circuit.

3. The conversion system as claimed in claim 1, wherein said compensation current is proportional to said at least one sampling signal.

4. The conversion system as claimed in claim 1, wherein said conversion circuit comprises a plurality of converters coupled to said plurality of cells in parallel respectively, and wherein each converter of said plurality of converters generates a corresponding sampling signal of said plurality of sampling signals.

5. The conversion system as claimed in claim 4, wherein one converter of said plurality of converters comprises an operational amplifier coupled to an upper cell of said plurality of cells in parallel, and wherein an operation current of said operational amplifier flows into a positive terminal of a lower cell of said plurality of cells.

6. The conversion system as claimed in claim 5, wherein said operation current is proportional to a cell voltage of said lower cell.

7. The conversion system as claimed in claim 1, wherein each sampling signal of said plurality of sampling signals comprises a sampling voltage proportional to a corresponding cell voltage of said plurality of cell voltages.

8. The conversion system as claimed in claim 7, wherein said sampling voltage is compared with a reference voltage that is with respect to said same reference level.

9. The conversion system as claimed in claim 1, wherein said same reference level is ground.

10. A method for sampling a plurality of cell voltages of a plurality of cells, said method comprising:
generating a plurality of sampling signals indicative of said plurality of cell voltages respectively, wherein a level of each sampling signal of said plurality of sampling signals is with respect to a same reference level;
generating a compensation current that flows through at least one cell of said plurality of cells according to at least one sampling signal of said plurality of sampling signals;
balancing a plurality of currents respectively flowing through said plurality of cells by said compensation current;
generating a reference current according to said at least one sampling signal; and
generating said compensation current by a current source coupled to said plurality of cells according to said reference current.

11. The method as claimed in claim 10, wherein said compensation current is proportional to said at least one sampling signal.

12. The method as claimed in claim 10, further comprising:
generating said plurality of sampling signals by a plurality of converters coupled to said plurality of cells in parallel respectively.

13. The method as claimed in claim 12, wherein one converter of said plurality of converters comprises an operational amplifier coupled to an upper cell of said plurality of cells in parallel, and wherein an operation current of said operational amplifier flows into a positive terminal of a lower cell of said plurality of cells.

14. The method as claimed in claim 13, wherein said operation current is proportional to a cell voltage of said lower cell.

15. The method as claimed in claim 10, wherein each sampling signal of said plurality of sampling signals comprises a sampling voltage proportional to a corresponding cell voltage of said plurality of cell voltages.

16. The method as claimed in claim 15, further comprising:
comparing said sampling voltage with a reference voltage that is with respect to said same reference level.

17. The method as claimed in claim 10, wherein said same reference level is ground.

18. A battery management system comprising:
a conversion circuit coupled to a plurality of cells for generating a plurality of sampling signals indicative of a plurality of cell voltages of said plurality of cells respectively, wherein a level of each sampling signal of said plurality of sampling signals is with respect to a same reference level;
a compensation circuit coupled to said conversion circuit for generating a compensation current that flows through at least one cell of said plurality of cells via said conversion circuit for balancing a plurality of currents respectively flowing through said plurality of cells;
a processor for receiving said plurality of sampling signals and for generating a control signal according to said plurality of sampling signals for controlling said plurality of cells; wherein said compensation circuit comprises:
a converter coupled to said conversion circuit for receiving at least one sampling signal of said plurality of sampling signals and for generating a reference current according to said at least one sampling signal; and
a current source coupled to said converter for receiving said reference current and for generating said compensation current according to said reference current.

19. The battery management system as claimed in claim 18, wherein said compensation current flows through at least a top cell of said plurality of cells via said conversion circuit.

20. The battery management system as claimed in claim 18, wherein said conversion circuit comprises a plurality of converters coupled to said plurality of cells in parallel respectively, and wherein each converter of said plurality of converters generates a corresponding sampling signal of said plurality of sampling signals.

21. The battery management system as claimed in claim 20, wherein one converter of said plurality of converters comprises an operational amplifier coupled to an upper cell of said plurality of cells in parallel, and wherein an operation current of said operational amplifier flows into a positive terminal of a lower cell of said plurality of cells.

22. The battery management system as claimed in claim 21, wherein said operation current is proportional to a cell voltage of said lower cell.

23. The battery management system as claimed in claim 18, wherein each sampling signal of said plurality of sampling signals comprises a sampling voltage proportional to a corresponding cell voltage of said plurality of cell voltages.

24. The battery management system as claimed in claim 23, wherein said sampling voltage is compared with a reference voltage that is with respect to said same reference level.

* * * * *